United States Patent
Huang et al.

(10) Patent No.: US 10,700,181 B2
(45) Date of Patent: Jun. 30, 2020

(54) FIN FIELD EFFECT TRANSISTOR (FINFET) DEVICE STRUCTURE AND METHOD FOR FORMING THE SAME

(71) Applicant: Taiwan Semiconductor Manufacturing Co., Ltd., Hsinchu (TW)

(72) Inventors: Wei-Han Huang, Taipei (TW); Wen-Yen Chen, Hsinchu (TW); Jing-Huei Huang, Yuanshan Township, Yilan County (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/590,418

(22) Filed: May 9, 2017

(65) Prior Publication Data
US 2018/0151695 A1    May 31, 2018

Related U.S. Application Data

(60) Provisional application No. 62/427,052, filed on Nov. 28, 2016.

(51) Int. Cl.
*H01L 29/66* (2006.01)
*H01L 29/08* (2006.01)
(Continued)

(52) U.S. Cl.
CPC .. *H01L 29/66545* (2013.01); *H01L 21/02323* (2013.01); *H01L 21/02337* (2013.01);
(Continued)

(58) Field of Classification Search
CPC ............ H01L 27/0886; H01L 27/1211; H01L 29/41791; H01L 29/66545; H01L 29/785; H01L 29/7848; H01L 21/3115; H01L 21/2236; H01L 21/823431; H01L 21/823821; H01L 21/845; H01L 27/0924; H01L 29/66795; H01L 29/0657; H01L 29/7842; H01L 21/823814; H01L 21/823418; H01L 21/22; H01L 21/38; H01L 29/66803; H01L 21/02694;
(Continued)

(56) References Cited

U.S. PATENT DOCUMENTS 8,772,109 B2    7/2014   Colinge
8,785,285 B2    7/2014   Tsai et al.
(Continued)

*Primary Examiner* — Mohsen Ahmadi
(74) *Attorney, Agent, or Firm* — Birch, Stewart, Kolasch & Birch, LLP

(57) ABSTRACT

A FinFET device structure and method for forming the same are provided. The method includes forming a fin structure over a substrate and forming a dummy gate electrode over a middle portion of the fin structure. The method also includes forming a spacer layer on the dummy gate electrode and on the fin structure and performing a plasma doping process on the dummy gate electrode and on the spacer layer. The method further includes performing an annealing process, wherein the annealing process is performed by using a gas comprising oxygen, such that a doped region is formed in a portion of the fin structure, and the spacer layer is doped with oxygen after the annealing process.

21 Claims, 14 Drawing Sheets

(51) Int. Cl.
  *H01L 29/78* (2006.01)
  *H01L 21/02* (2006.01)
  *H01L 21/22* (2006.01)
  *H01L 21/311* (2006.01)
  *H01L 21/3115* (2006.01)
  *H01L 21/38* (2006.01)
  *H01L 21/28* (2006.01)
  *H01L 29/423* (2006.01)
  *H01L 21/223* (2006.01)

(52) U.S. Cl.
  CPC ........ *H01L 21/02694* (2013.01); *H01L 21/22* (2013.01); *H01L 21/3115* (2013.01); *H01L 21/31144* (2013.01); *H01L 21/38* (2013.01); *H01L 29/0847* (2013.01); *H01L 29/66795* (2013.01); *H01L 29/66803* (2013.01); *H01L 29/66871* (2013.01); *H01L 29/785* (2013.01); *H01L 29/7831* (2013.01); *H01L 29/7856* (2013.01); *H01L 21/2236* (2013.01); *H01L 21/28008* (2013.01); *H01L 21/31111* (2013.01); *H01L 29/42376* (2013.01); *H01L 29/6681* (2013.01); *H01L 29/7848* (2013.01)

(58) Field of Classification Search
  CPC ......... H01L 21/02323; H01L 29/66871; H01L 29/7831; H01L 29/7856; H01L 29/6656; H01L 29/7851; H01L 29/66606
  See application file for complete search history.

(56) References Cited

U.S. PATENT DOCUMENTS

| | | | |
|---|---|---|---|
| 8,816,444 B2 | 8/2014 | Wann et al. | |
| 8,823,065 B2 | 9/2014 | Wang et al. | |
| 8,860,148 B2 | 10/2014 | Hu et al. | |
| 9,105,490 B2 | 8/2015 | Wang et al. | |
| 9,129,988 B1* | 9/2015 | Lee | H01L 29/66545 |
| 9,236,267 B2 | 1/2016 | De et al. | |
| 9,236,300 B2 | 1/2016 | Liaw | |
| 9,379,242 B1* | 6/2016 | Lin | H01L 29/7847 |
| 9,520,482 B1 | 12/2016 | Chang et al. | |
| 9,576,814 B2 | 2/2017 | Wu et al. | |
| 9,653,604 B1* | 5/2017 | Colinge | H01L 21/02667 |
| 9,722,076 B2* | 8/2017 | Sun | H01L 29/7831 |
| 2011/0195555 A1* | 8/2011 | Tsai | H01L 21/2236 438/301 |
| 2011/0269287 A1* | 11/2011 | Tsai | H01L 21/2254 438/306 |
| 2012/0070953 A1* | 3/2012 | Yu | H01L 21/2236 438/301 |
| 2014/0217483 A1* | 8/2014 | Choi | H01L 29/785 257/288 |
| 2015/0132909 A1* | 5/2015 | Choi | H01L 29/66803 438/283 |
| 2016/0071945 A1* | 3/2016 | Wang | H01L 29/42392 257/347 |
| 2016/0086946 A1* | 3/2016 | Yin | H01L 21/823821 257/369 |
| 2016/0141394 A1* | 5/2016 | Lu | H01L 29/66795 438/283 |
| 2016/0172439 A1* | 6/2016 | Lin | H01L 29/0642 257/401 |
| 2016/0276466 A1* | 9/2016 | Leobandung | H01L 29/66795 |
| 2016/0315191 A1* | 10/2016 | Tsai | H01L 29/7834 |
| 2016/0343857 A1* | 11/2016 | Colinge | H01L 29/66795 |
| 2017/0069737 A1* | 3/2017 | Choi | H01L 29/66803 |
| 2017/0133486 A1* | 5/2017 | Zhou | H01L 21/823857 |
| 2018/0019340 A1* | 1/2018 | Adusumilli | H01L 29/7851 |

* cited by examiner

FIN FIELD EFFECT TRANSISTOR (FINFET) DEVICE STRUCTURE AND METHOD FOR FORMING THE SAME

CROSS REFERENCE TO RELATED APPLICATIONS

This Application claims the benefit of U.S. Provisional Application No. 62/427,052, filed on Nov. 28, 2016, and entitled "Fin field effect transistor (FinFET) device structure and method for forming the same", the entirety of which is incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

As the semiconductor industry has progressed into nanometer technology process nodes in pursuit of higher device density, higher performance, and lower costs, challenges from both fabrication and design issues have resulted in the development of three-dimensional designs, such as the fin field effect transistor (FinFET). FinFETs are fabricated with a thin vertical "fin" (or fin structure) extending from a substrate. The channel of the FinFET is formed in this vertical fin. A gate is provided over the fin. The advantages of a FinFET may include reducing the short channel effect and providing a higher current flow.

Although existing FinFET devices and methods of fabricating FinFET devices have generally been adequate for their intended purposes, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
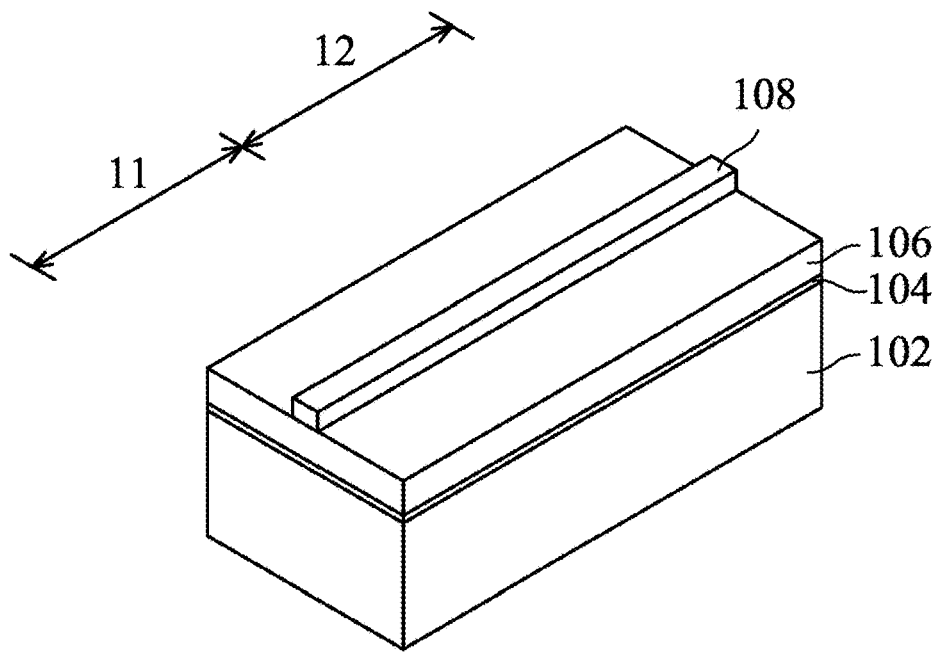
FIGS. 1A-1O show perspective representations of various stages of forming a FinFET device structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Embodiments for forming a fin field effect transistor (FinFET) device structure are provided. FIGS. 1A-1O show perspective representations of various stages of forming a FinFET device structure, in accordance with some embodiments of the disclosure.

Referring to FIG. 1A, a substrate 102 is provided. The substrate 102 includes a first region 11 and a second region 12. In some embodiments, an NMOS FinFET device structure is formed in the first region 11, and a PMOS FinFET device structure is formed in the second region 12.

The substrate 102 may be made of silicon or other semiconductor materials. In some embodiments, the substrate 102 is a silicon wafer. Alternatively or additionally, the substrate 102 may include other elementary semiconductor materials such as germanium. In some embodiments, the substrate 102 is made of a compound semiconductor such as silicon carbide, gallium arsenic, indium arsenide, or indium phosphide. In some embodiments, the substrate 102 is made of an alloy semiconductor such as silicon germanium, silicon germanium carbide, gallium arsenic phosphide, or gallium indium phosphide. In some embodiments, the substrate 102 includes an epitaxial layer. For example, the substrate 102 has an epitaxial layer overlying a bulk semiconductor.

Afterwards, a dielectric layer 104 and a mask layer 106 are formed over the substrate 102, and a photoresist layer 108 is formed over the mask layer 106. The photoresist layer 108 is patterned by a patterning process. The patterning process includes a photolithography process and an etching process. The photolithography process includes photoresist coating (e.g., spin-on coating), soft baking, mask aligning, exposure, post-exposure baking, developing the photoresist, rinsing and drying (e.g., hard baking). The etching process may include a dry etching process or a wet etching process.

The dielectric layer 104 is a buffer layer between the substrate 102 and the mask layer 106. In addition, the dielectric layer 104 is used as a stop layer when the mask layer 106 is removed. The dielectric layer 104 may be made of silicon oxide. The mask layer 106 may be made of silicon oxide, silicon nitride, silicon oxynitride, or another applicable material. In some other embodiments, more than one mask layer 106 is formed over the dielectric layer 104.

The dielectric layer 104 and the mask layer 106 are formed by deposition processes, such as a chemical vapor deposition (CVD) process, a high-density plasma chemical vapor deposition (HDPCVD) process, a spin-on process, a sputtering process, or another applicable process.

Figure 1B:
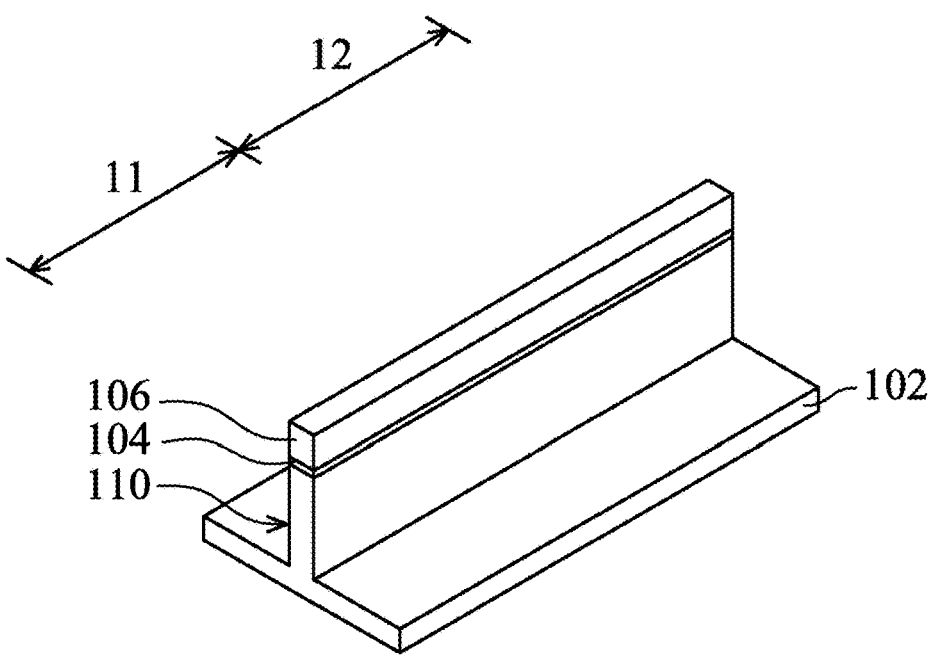

As shown in FIG. 1B, after the photoresist layer 108 is patterned, the dielectric layer 104 and the mask layer 106 are patterned by using the patterned photoresist layer 108 as a mask in accordance with some embodiments. As a result, a patterned dielectric layer 104 and a patterned mask layer 106 are obtained. Afterwards, the patterned photoresist layer 108 is removed.

Afterwards, an etching process is performed on the substrate 102 to form a fin structure 110 by using the patterned dielectric layer 104 and the patterned mask layer 106 as a mask. The etching process may be a dry etching process or a wet etching process.

In some embodiments, the substrate 102 is etched by a dry etching process. The dry etching process includes using a fluorine-based etchant gas, such as $SF_6$, $C_xF_y$, $NF_3$ or a combination thereof. The etching process may be a time-controlled process, and continue until the fin structure 110 reaches a predetermined height. In some other embodiments, the fin structure 110 has a width that gradually increases from the top portion to the lower portion.

Figure 1C:
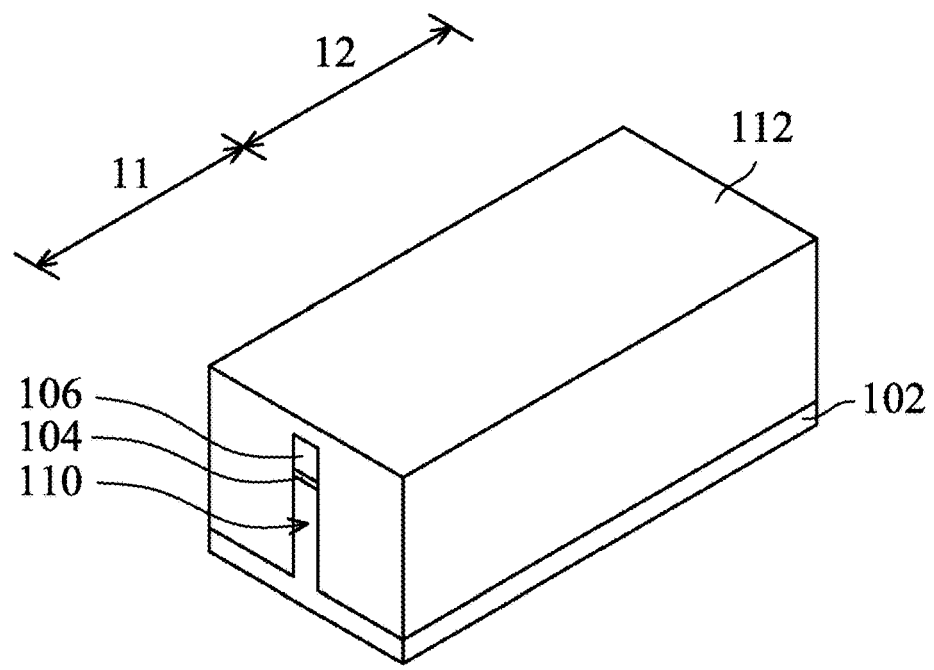

As shown in FIG. 1C, after the fin structure 110 is formed, an insulating layer 112 is formed to cover the fin structure 110 over the substrate 102 in accordance with some embodiments.

In some embodiments, the insulating layer 112 is made of silicon oxide, silicon nitride, silicon oxynitride, fluoride-doped silicate glass (FSG), or another low-k dielectric material. The insulating layer 112 may be deposited by a chemical vapor deposition (CVD) process, a spin-on-glass process, or another applicable process.

Afterwards, the insulating layer 112 is thinned or planarized to expose the top surface of the patterned mask layer 106. In some embodiments, the insulating layer 112 is thinned by a chemical mechanical polishing (CMP) process. Afterwards, the patterned dielectric layer 104 and the patterned mask layer 106 are removed.

Figure 1D:
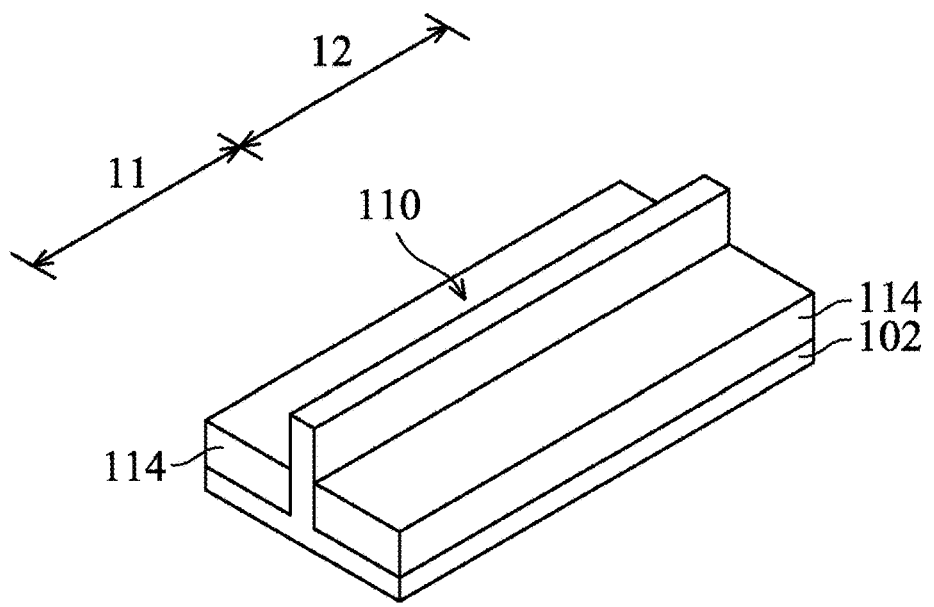

Afterwards, as shown in FIG. 1D, a portion of the insulating layer 112 is removed to form an isolation structure 114, in accordance with some embodiments. The isolation structure 114 may be a shallow trench isolation (STI) structure surrounding the fin structure 110. A lower portion of the fin structure 110 is surrounded by the isolation structure 114, and an upper portion of the fin structure 110 protrudes from the isolation structure 114. In other words, a portion of the fin structure 110 is embedded in the isolation structure 114. The isolation structure 114 prevents electrical interference or crosstalk.

FIGS. 2A-2K show cross-sectional representations of various stages of forming a FinFET device structure shown in FIGS. 1E-1O, in accordance with some embodiments of the disclosure. FIGS. 2A-2K are a cross-sectional representation taken along line AA' in FIGS. 1E-1O.

Figure 1E:
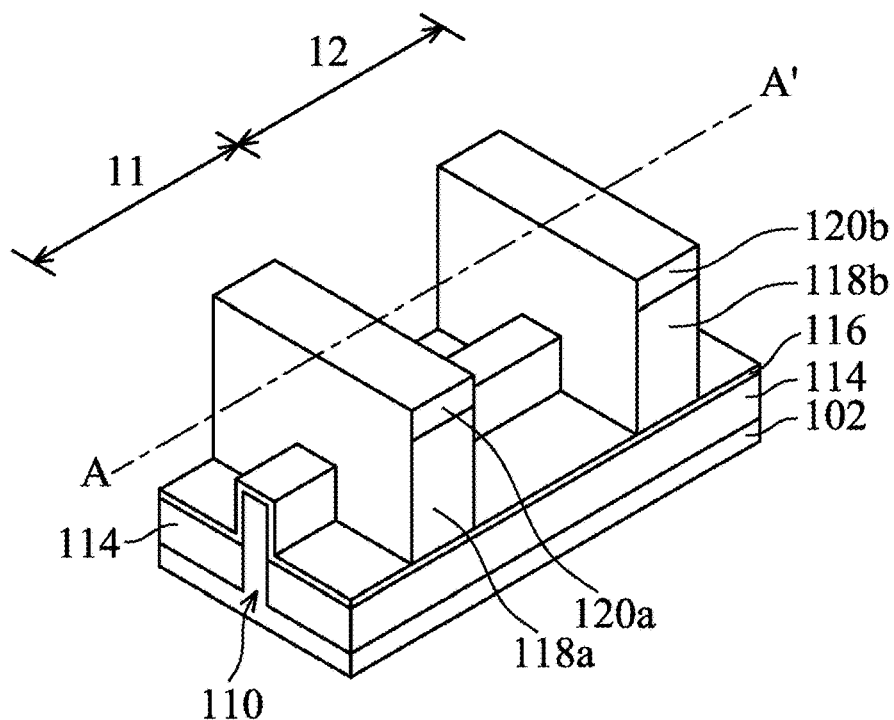
Figure 2A:
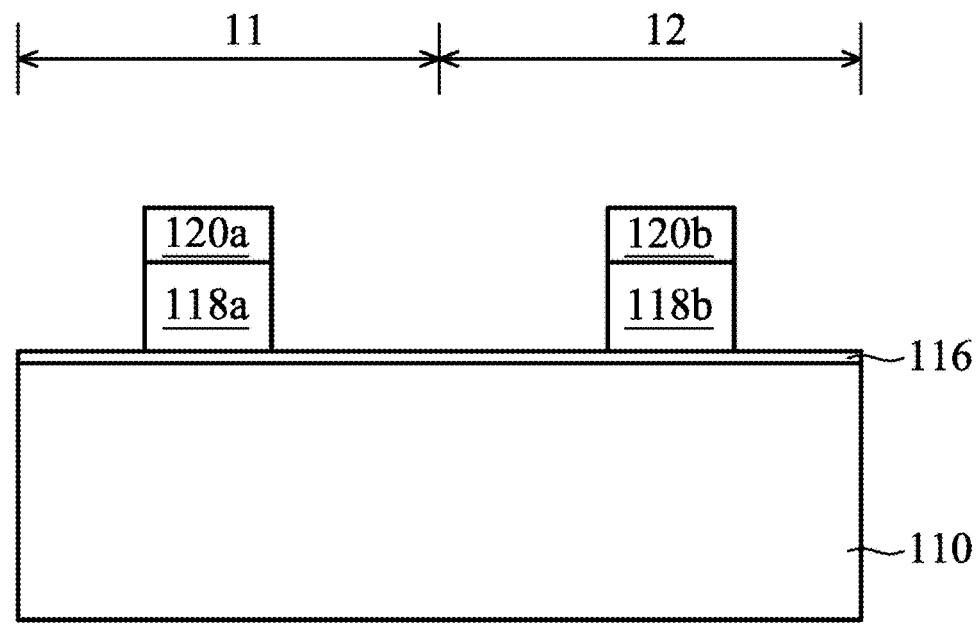
FIGS. 2A-2K show cross-sectional representations of various stages of forming a FinFET device structure shown in FIGS. 1E-1O, in accordance with some embodiments of the disclosure.

Afterwards, as shown in FIG. 1E and FIG. 2A, a dummy gate dielectric layer 116 is formed on the fin structure 110, the isolation structure 114, and a first dummy gate electrode 118a, a second dummy gate electrode 118b are formed on the dummy gate dielectric layer 116, in accordance with some embodiments.

The first dummy gate electrode 118a and the second dummy gate electrode 118b are formed across the fin structure 110 and extends over the isolation structure 114. A first hard mask layer 120a is formed on the first dummy gate electrode 118a in the first region 11, and a second hard mask layer 120b is formed on the second dummy gate electrode 118b in the second region 12.

Figure 1F:
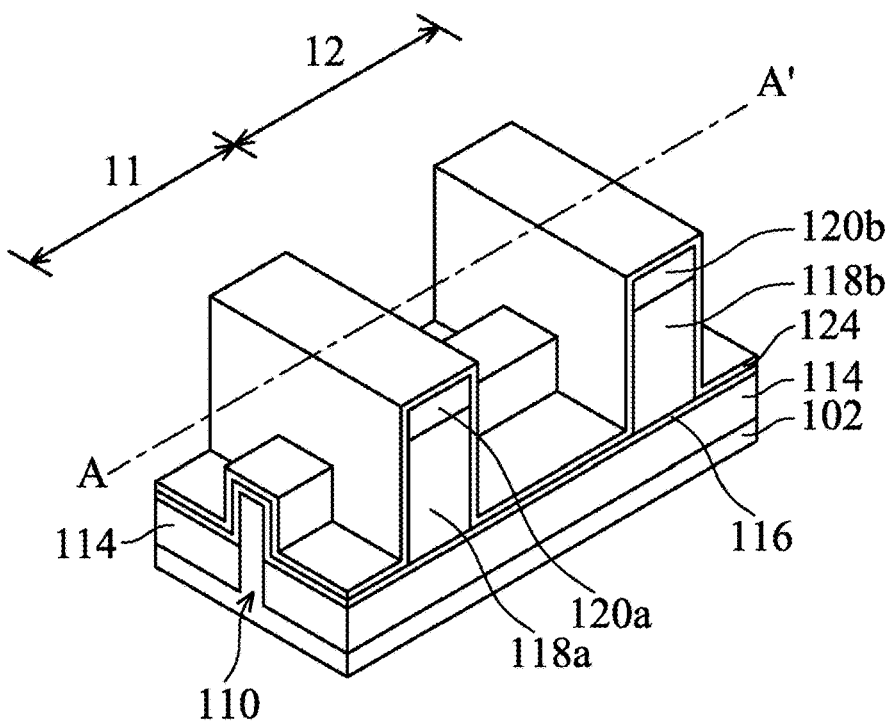
Figure 2B:
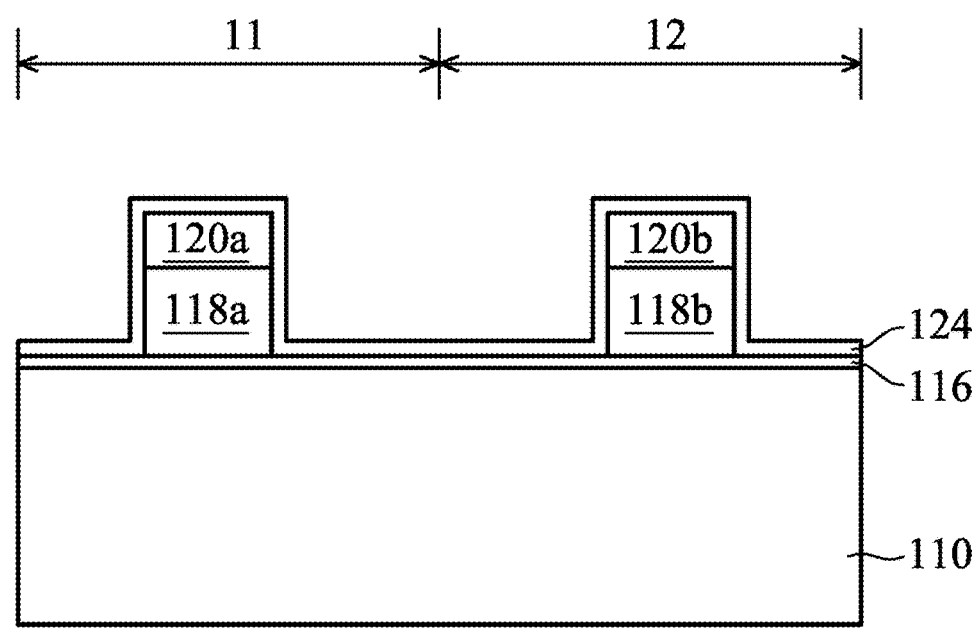

Afterwards, as shown in FIG. 1F and FIG. 2B, a spacer layer 124 is formed on the first hard mask layer 120a, the second hard mask layer 120b and the dummy gate dielectric layer 116, in accordance with some embodiments. The spacer layer 124 may be a single layer or multiple layers. The spacer layer 124 may be made of silicon oxide, silicon nitride, silicon oxynitride, and/or dielectric materials. In some embodiments, the spacer layer 124 is formed by chemical vapor deposition (CVD) process, a spin-on-glass process, or another applicable process.

Figure 1G:
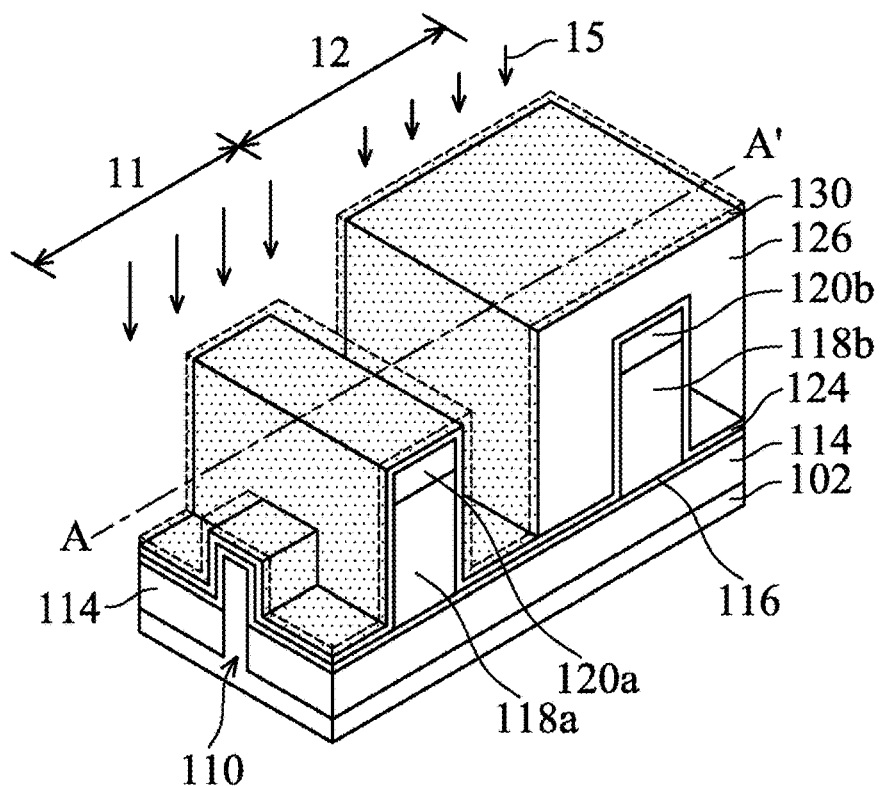
Figure 2C:
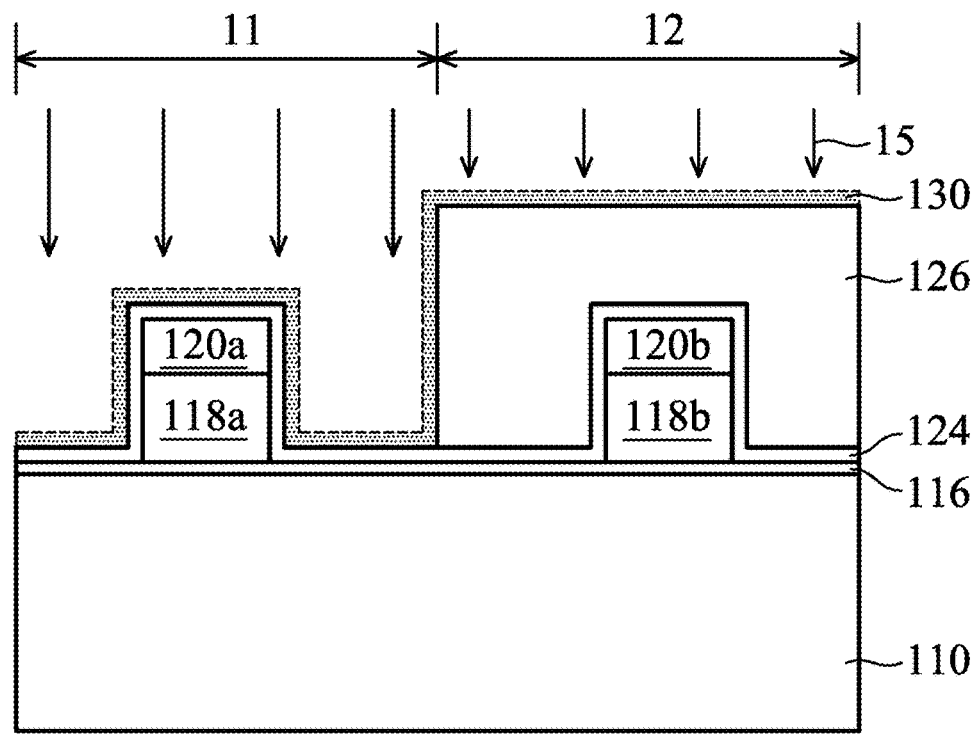

Next, as shown in FIG. 1G and FIG. 2C, a third hard mask layer 126 is formed on the second hard mask layer 120b in the second region 12 to protect the underlying layers from being etched, in accordance with some embodiments. Afterwards, a plasma doping process 15 is performed on the exposed layers in the first region 11. More specifically, the plasma doping process 15 is performed on the spacer layer 124 in the first region 11. The plasma doping process 15 is configured to form a doped region 220 (shown in FIG. 2E) in the subsequent process.

It should be noted that if a doped region (e.g. lightly doped drain (LDD) region) is by an ion implantation process, the doped region is shadowed by a tall gate structure. Especially when the finFET device structure has a fine spacing, which is in the range of nanometers (nm), between neighboring gate structures, the formation of the doped region becomes difficult due to the shadow effect. In order to resolve the shadow issue, the plasma doping process 15 is used in this disclosure to form the doped region 220 (shown in FIG. 2E). The plasma ions in the plasma doping process 15 could move in different directions, and the shadow effect may be prevented.

The plasma doping process 15 includes performing a deposition process and simultaneously performing a knock-on process. The deposition process is configured to form a dopant source layer 130 over the spacer layer 124 and the first hard mask layer 120a in the first region 11. In some embodiments, the dopant source layer 130 includes an arsenic (As) layer. In some embodiments, the deposition process includes arsenic (As) dopant source gases, such as arsine ($AsH_3$). The arsine gas ($AsH_3$) can be dissociated into As, AsH and $AsH_2$, which may be deposited on the surface of the spacer layer 124 in the first region 11. Furthermore, the deposition process may also include a dilution gas, such as argon (Ar), neon (Ne), helium (He), hydrogen (H), Krypton (Kr), Xenon (Xe), or a combination thereof.

The knock-on process is configured to drive a dopant of the dopant source layer 130 into a portion of the fin structure 110. The knock-on process may include injecting a knock-on gas in the first region 11. The knock-on process is used to uniformly push the dopant of the dopant source layer 130 into the portion of the fin structure 110 through the spacer layer 124 and the first dummy gate dielectric layer 116a in the first region 11. The knock-on process is performed by using a gas comprising hydrogen ($H_2$), nitrogen ($N_2$), helium (He), argon (Ar), krypton (Kr), xenon (Xe), neon (Ne), or a combination thereof.

In some embodiments, the plasma doping process 15 is performed at a temperature in a range from about 25 degrees to about 35 degrees. In some embodiments, a RF power of the plasma doping process 15 is in a range from about 400 W to about 200 W.

Figure 1H:
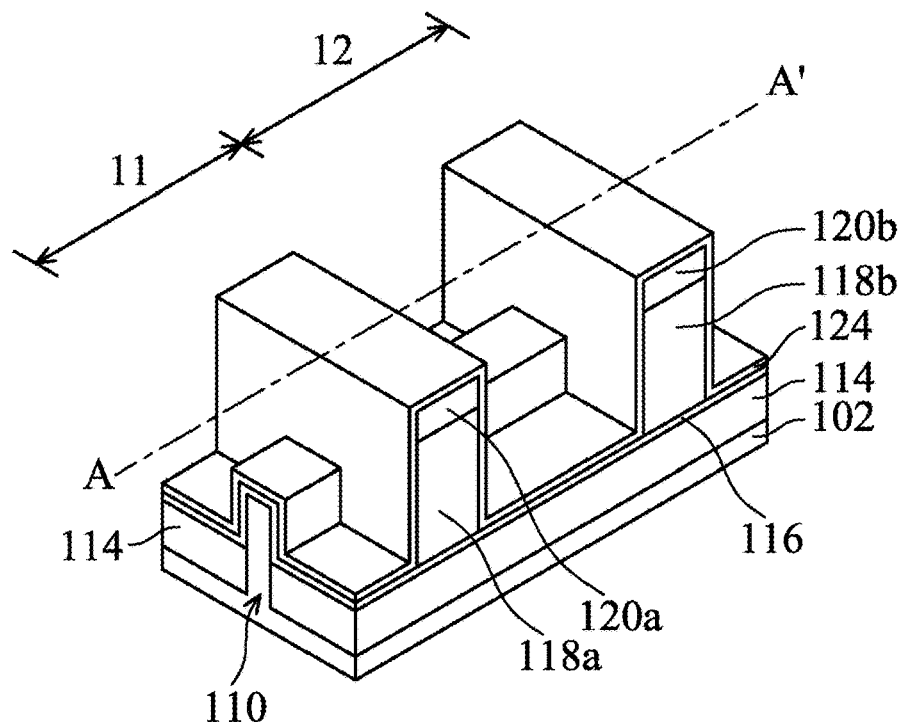
Figure 2D:
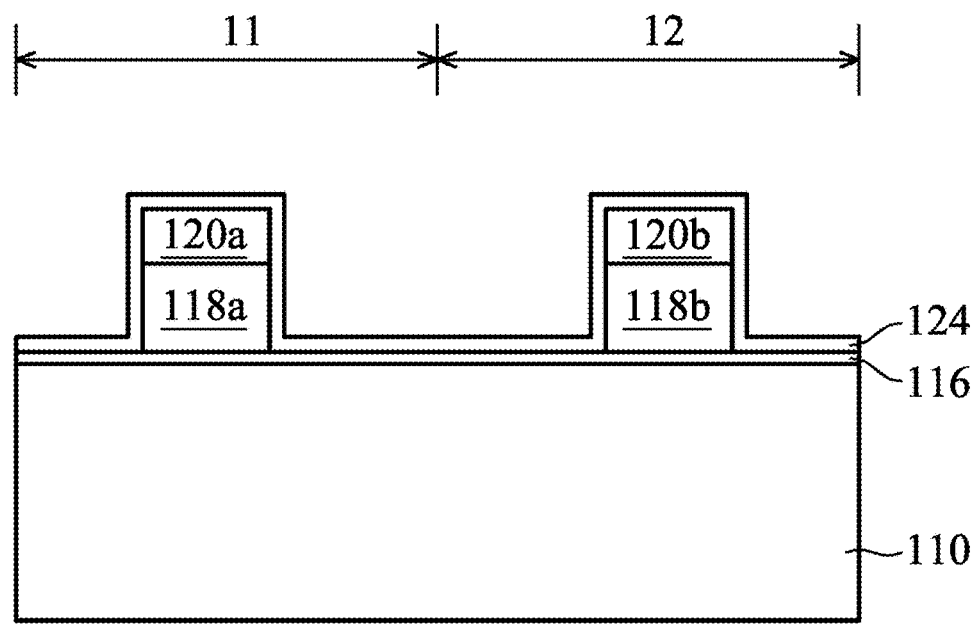

Afterwards, as shown in FIG. 1H and FIG. 2D, after the plasma doping process 15, the third hard mask layer 126 is removed, in accordance with some embodiments. In some embodiments, the third hard mask layer 126 is removed by an etching process, such as a dry etching process or a wet etching process.

Figure 1I:
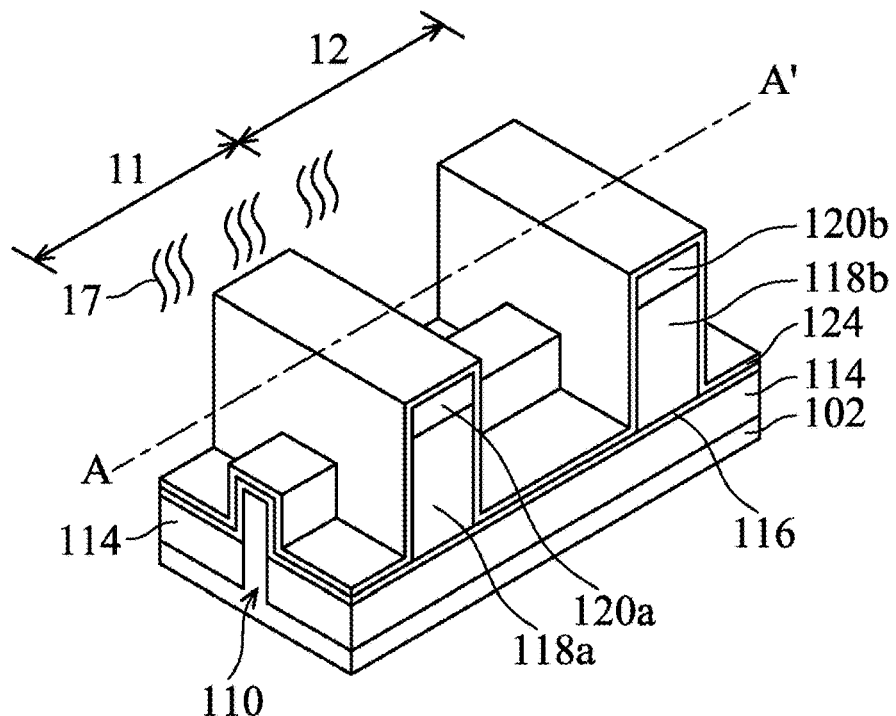
Figure 2E:
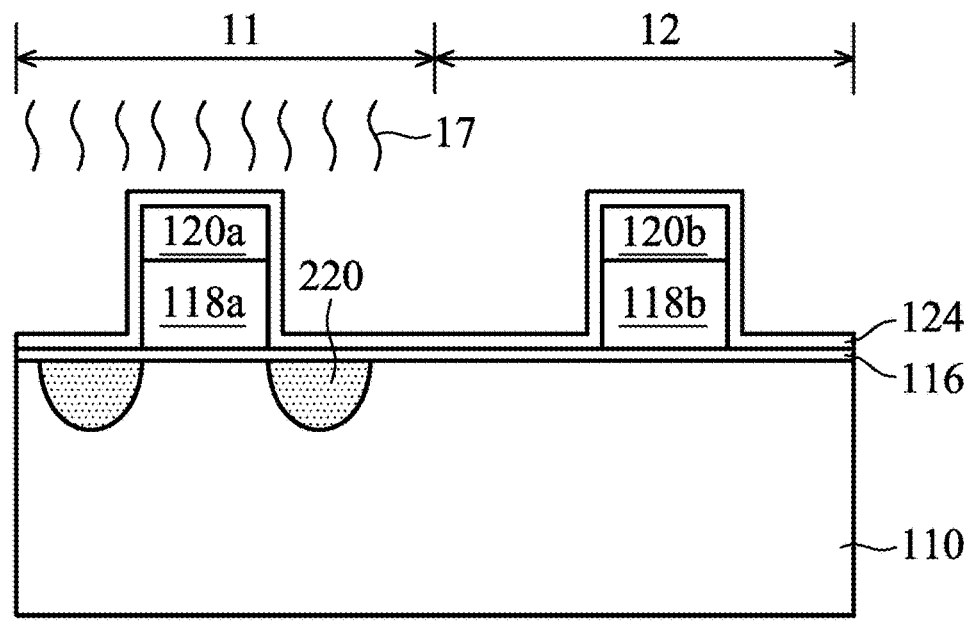

Afterwards, as shown in FIG. 1I and FIG. 2E, an annealing process 17 is performed on the spacer layer 124 in the first region 11, in accordance with some embodiments. As a result, the doped region 220 is formed below the dummy gate dielectric layer 116.

The annealing process 17 is a heat treatment process. The annealing process 17 is performed to cause the dopant to diffuse into a portion of the fin structure 110. In other words, the annealing process 17 is used to activate the dopant of dopant source layer 130 after the plasma doping process 15. In addition, the annealing process 17 is used to repair the damage that is caused by the plasma doping process 15. In some embodiments, the annealing process 17 includes a rapid thermal anneal (RTA), a rapid thermal oxidation, a plasma annealing, or a microwave annealing. In some embodiments, the annealing process 17 is performed at a temperature in a range from about 400 degrees to 1200 degrees. When the annealing process 17 is operated at a temperature in the above-mentioned range, the doped region 220 in the first region 11 may be formed in a predetermined location.

As mentioned above, the dopant source layer 130 includes an arsenic (As) layer. During the annealing process 17, the arsenic (As) may be evaporated before it is diffused into the fin structure 110 because arsenic is a sublimable material at a temperature of about 615 degrees. If the arsenic (As) is exposed to atmosphere, arsenic oxide (AsxOy) and arsine gas ($ArH_3$) will be formed. The arsine gas ($ArH_3$) is a highly toxic gas and is also flammable, and thus the concentration of arsine gas should be well controlled to meet safety requirements. Therefore, the disclosure provides a method for preventing the formation of toxic compounds after the annealing process 17. While the annealing process 17 is being performed in a chamber, a gas including oxygen gas ($O_2$) is being introduced into the chamber. In addition, a carrier gas is simultaneously introduced to the chamber, and the carrier gas includes nitrogen gas ($N_2$). The arsenic (As) of the dopant source layer 130 is consumed by reacting with oxygen gas ($O_2$) to form arsenic oxide (AsxOy) which is solid at room temperature and less toxic than the arsine gas ($ArH_3$). The arsenic oxide (AsxOy) (boiling point 465 degrees) is vaporized at a temperature higher than the boiling point. In some embodiments, the substrate 102 or the wafer in the chamber is higher than 1000 degrees, and therefore arsenic oxide (AsxOy) is not formed on the substrate 102 or the wafer. In some embodiments, a heating process is performed to vaporize the arsenic oxide (AsxOy) and then the vapor is exhausted through the pump.

In some embodiments, the gas includes oxygen gas ($O_2$) and nitrogen gas ($N_2$). The oxygen gas ($O_2$) has a flow rate in a range from about 5 sccm to about 5000 sccm, and the nitrogen gas ($N_2$) has a flow rate in a range from about 5 sccm to about 50000 sccm. If the flow rate of the oxygen gas is too low, the arsine gas may not be consumed completely. If the flow rate of the oxygen is too high, oxygen gas may be wasted when the oxidation reaction is complete.

In some other embodiments, the gas used in the annealing process 17 includes atomic oxygen (O), oxygen ($O_2$), ozone ($O_3$), nitrous oxide ($N_2O$), nitric oxide (NO), nitrogen dioxide ($NO_2$), dinitrogen pentoxide ($N_2O_5$), or a combination thereof. In some embodiments, the concentration of the arsenic in the doped region 220 is in a range from about $1E19$ atoms/cm$^3$ to about $1E20$ atoms/cm$^3$.

Figure 1J:
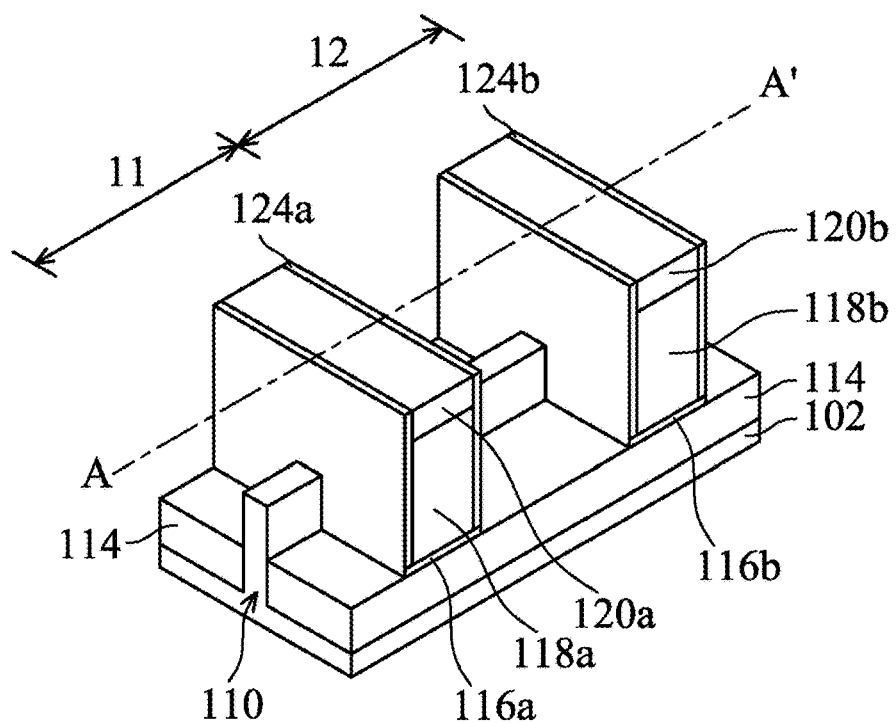
Figure 2F:
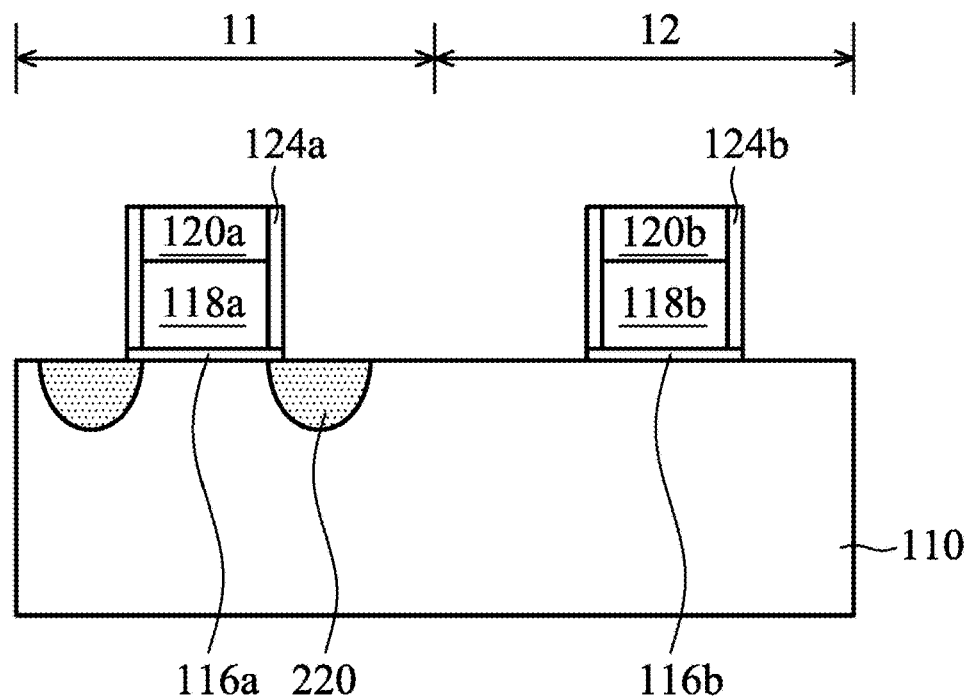

Afterwards, as shown in FIG. 1J and FIG. 2F, an etching process is performed to remove a portion of the spacer layer 124 and a portion of the dummy gate dielectric layer 116 to expose a top surface of the first hard mask layer 120a and a top surface of the second hard mask layer 120b, in accordance with some embodiments. The etching process may include multiple etching steps. The spacer layer 1240 and the dummy gate dielectric layer 116 may be removed by separate etching process.

A first dummy gate dielectric layer 116a is formed in the first region 11, and a second dummy gate dielectric layer 116b is formed in the second region 12. Furthermore, a first spacer layer 124a is formed on opposite sidewalls of the first dummy gate electrode 118a, and a second spacer layer 124b is formed on opposite sidewalls of the second dummy gate electrode 118b.

It should be noted that, the dopants diffuse into a portion of the fin structure 110 through the spacer layer 124 and the dummy gate dielectric layer 116 when the annealing process 17 with oxygen gas is performed. Therefore, the first spacer layer 124a and the first dummy gate dielectric layer 116a are both doped with oxygen. In some embodiments, the first spacer layer 124a is made of nitride, and after the annealing process 17, the nitride becomes oxygen-doped nitride. In some embodiments, the first spacer layer 124a has an oxygen-gradient concentration, and the oxygen-gradient concentration is gradually decreased from a top surface to a bottom surface of the first spacer layer 124a. In some other embodiments, the oxygen-gradient concentration is in a range from about 0.1 atom (%) to about 15 atom (%).

Figure 1K:
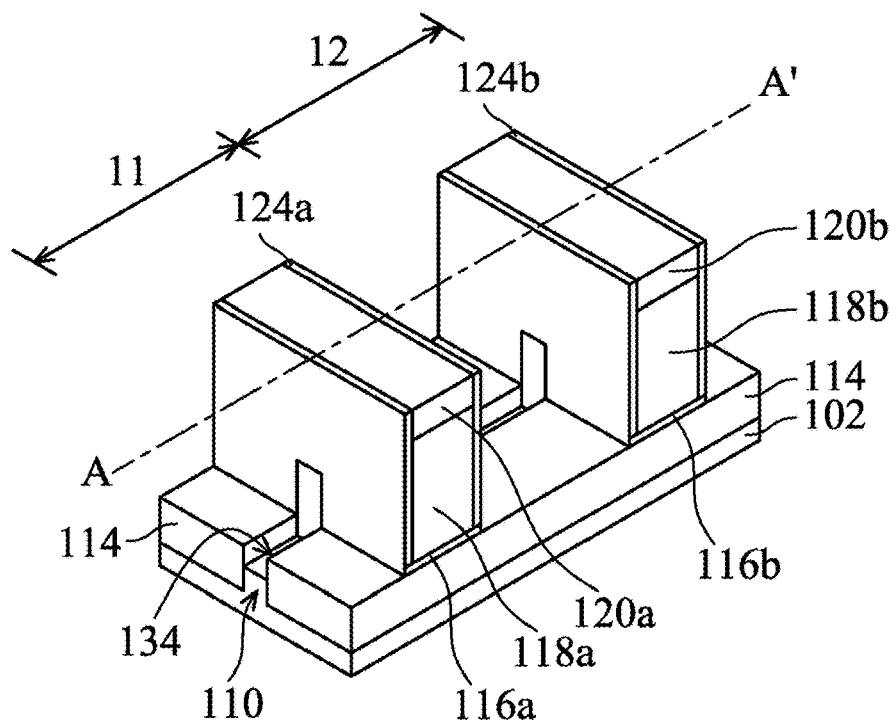
Figure 2G:
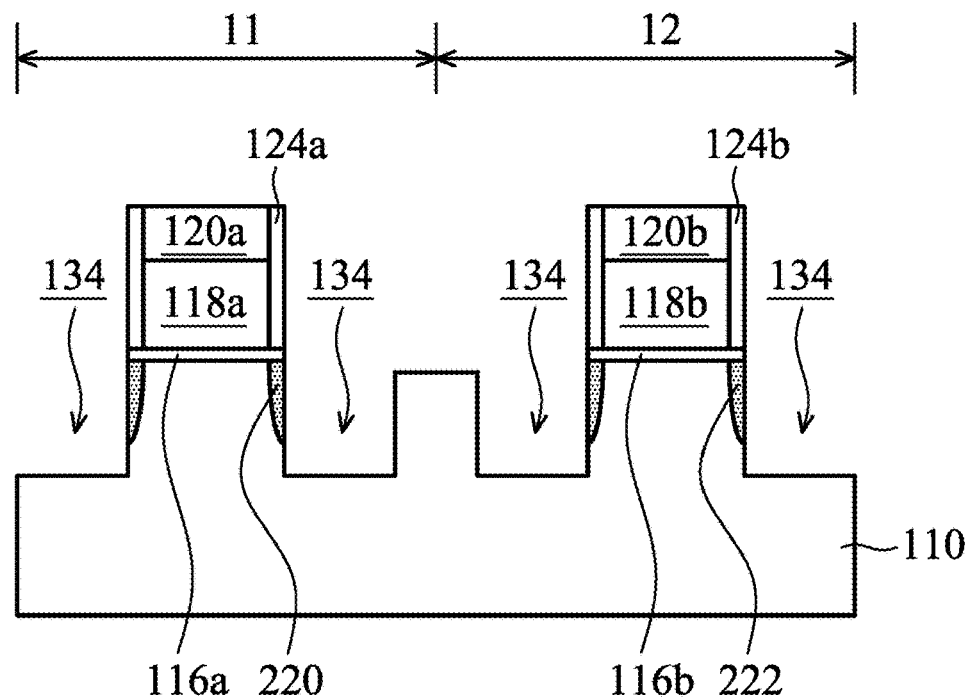

Afterwards, as shown in FIG. 1K and FIG. 2G, a portion of the fin structure 110 is removed to form a recess 134, in accordance with some embodiments. A bottom surface of the recess 134 is lower than a top surface of the isolation structure 114. As shown in FIG. 2G, although a portion of the doped region 220 is removed, some of the doped region 220 which is directly below the first spacer layer 124a is left.

In the second region 12, another doped region 222 is formed below the second dummy gate dielectric layer 116b. In some embodiments, an NMOS FinFET device structure is formed in the first region 11, and a PMOS FinFET device structure is formed in the second region 12. The NMOS FinFET device structure includes the fin structure 110 doped with N-type dopants such as arsenic (As). The PMOS FinFET device structure includes the fin structure 110 doped with P-type dopants such as boron (B).

Figure 1L:
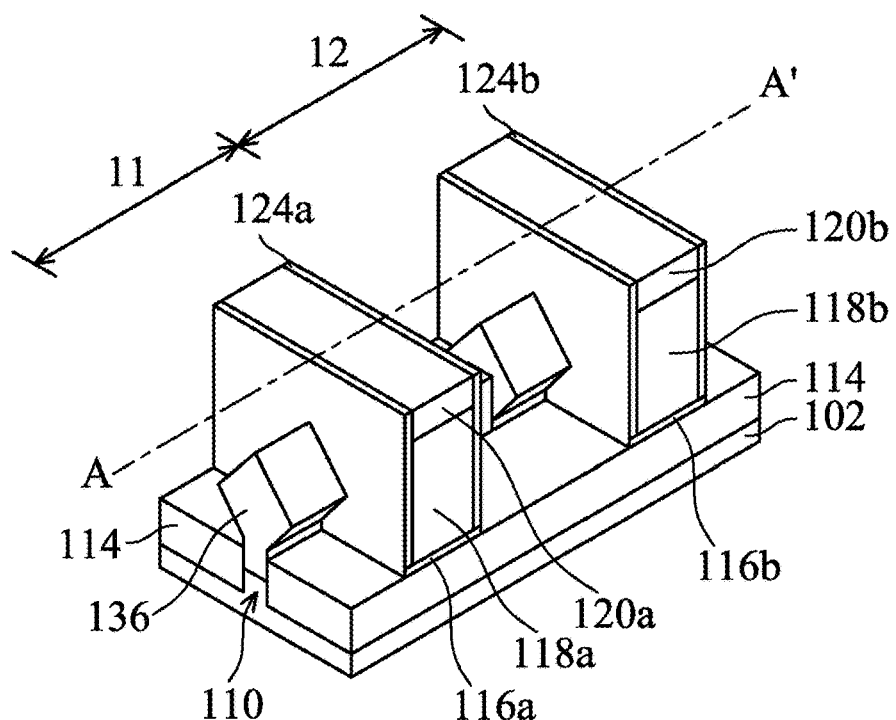
Figure 2H:
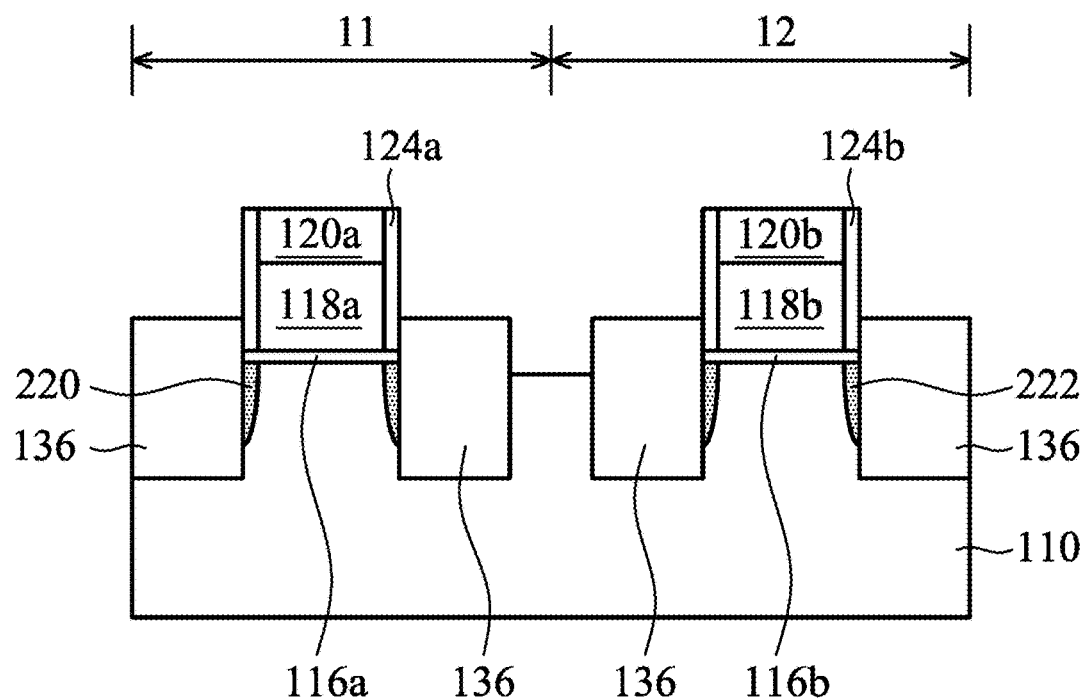

Afterwards, as shown in FIG. 1L and FIG. 2H, a strained material is grown in the recess 134 to form a source/drain (S/D) structure 136, in accordance with some embodiments. In addition, the lattice constant of the strained material may be different from the lattice constant of the substrate 102.

In some embodiments, the S/D structure 136 includes Ge, SiGe, InAs, InGaAs, InSb, GaAs, GaSb, InAlP, InP, or the like. In some embodiments, the S/D structure 136 has a diamond shape. In some embodiments, the S/D structure 136 is formed by an epitaxial process, such as a selective epitaxial growth (SEG) process, CVD deposition techniques (e.g., vapor-phase epitaxy (VPE) and/or ultra-high vacuum CVD (UHV-CVD)), molecular beam epitaxy, or other suitable epi processes.

As shown in FIG. 2H, the S/D structure 136 is formed adjacent to or next to the doped region 220 in the first region 11. In addition, the S/D structure 136 is formed adjacent to or next to another doped region 230 in the second region 12. The top surface of the S/D structure 136 is higher than a top surface of the fin structure 110.

Figure 1M:
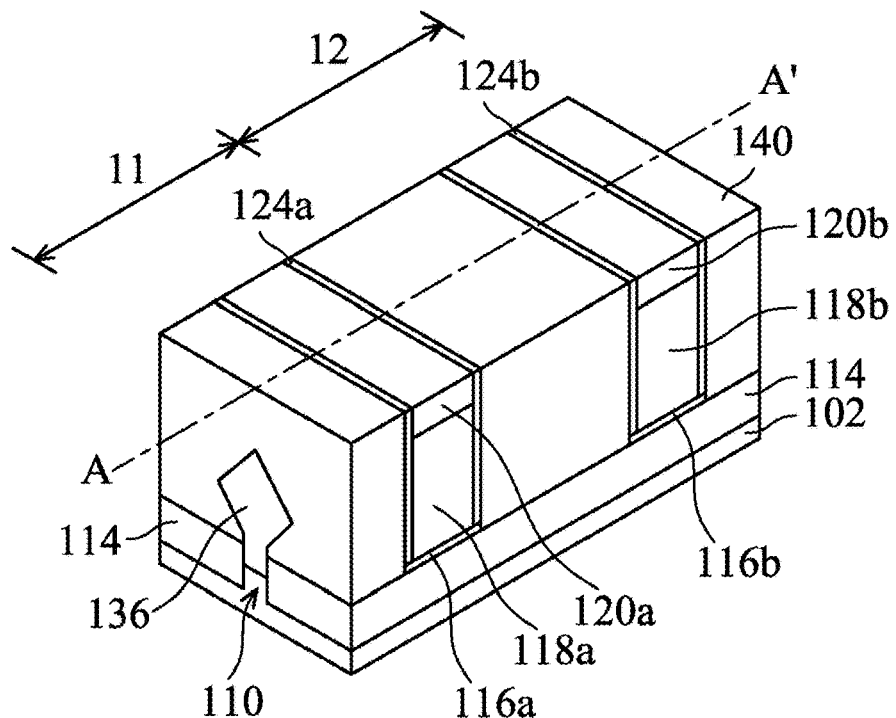
Figure 2I:
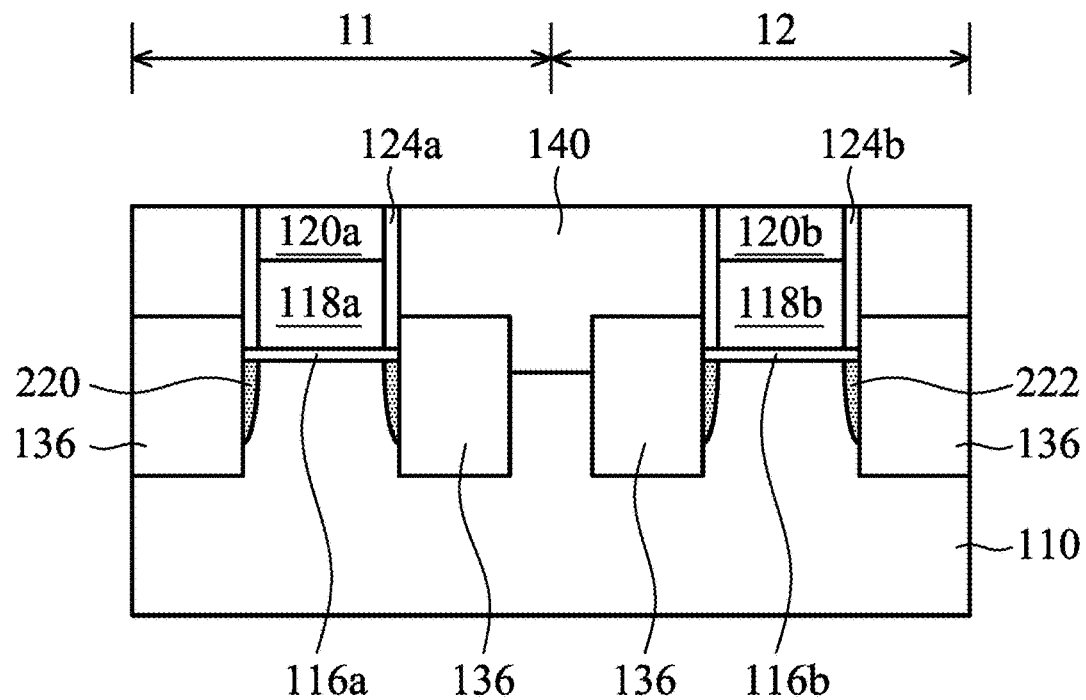

Afterwards, as shown in FIG. 1M and FIG. 2I, an interlayer dielectric (ILD) structure 140 is formed over the S/D structure 136, the first hard mask layer 120a, and the second hard mask layer 120b, in accordance with some embodiments.

The ILD structure 140 may include multilayers made of multiple dielectric materials, such as silicon oxide, silicon nitride, silicon oxynitride, tetraethoxysilane (TEOS), phosphosilicate glass (PSG), borophosphosilicate glass (BPSG), low-k dielectric material, and/or other applicable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The ILD structure 140 may be formed by chemical vapor deposition (CVD), physical vapor deposition, (PVD), atomic layer deposition (ALD), spin-on coating, or other applicable processes. Afterwards, a polishing process is performed on the ILD structure 140 until the top surface of the first hard mask layer 120a and the top surface of the second hard mask layer 120b are exposed. In some embodiments, the ILD structure 140 is planarized by a chemical mechanical polishing (CMP) process.

Figure 1N:
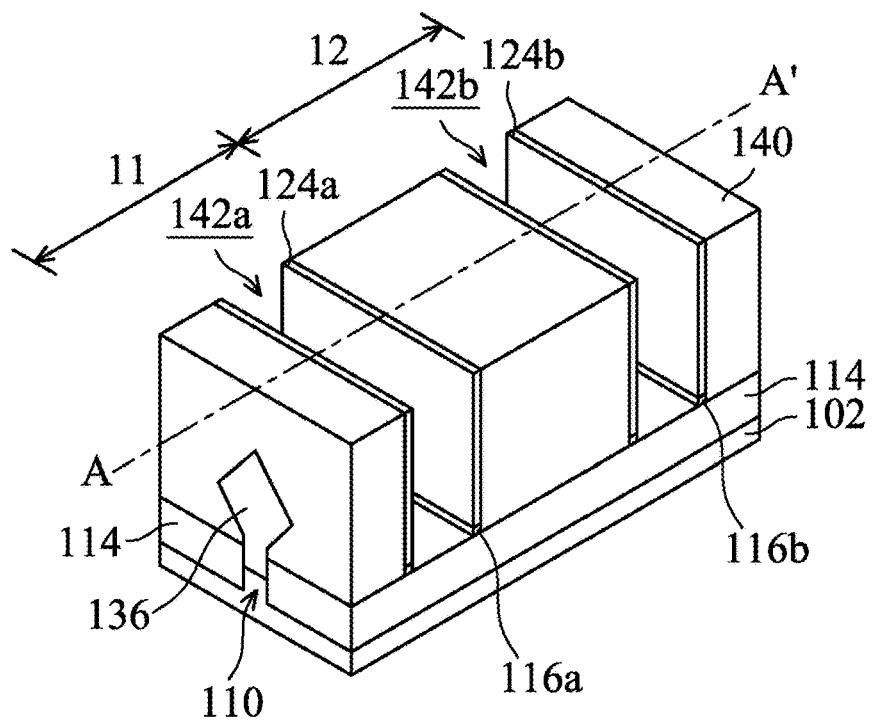
Figure 1O:
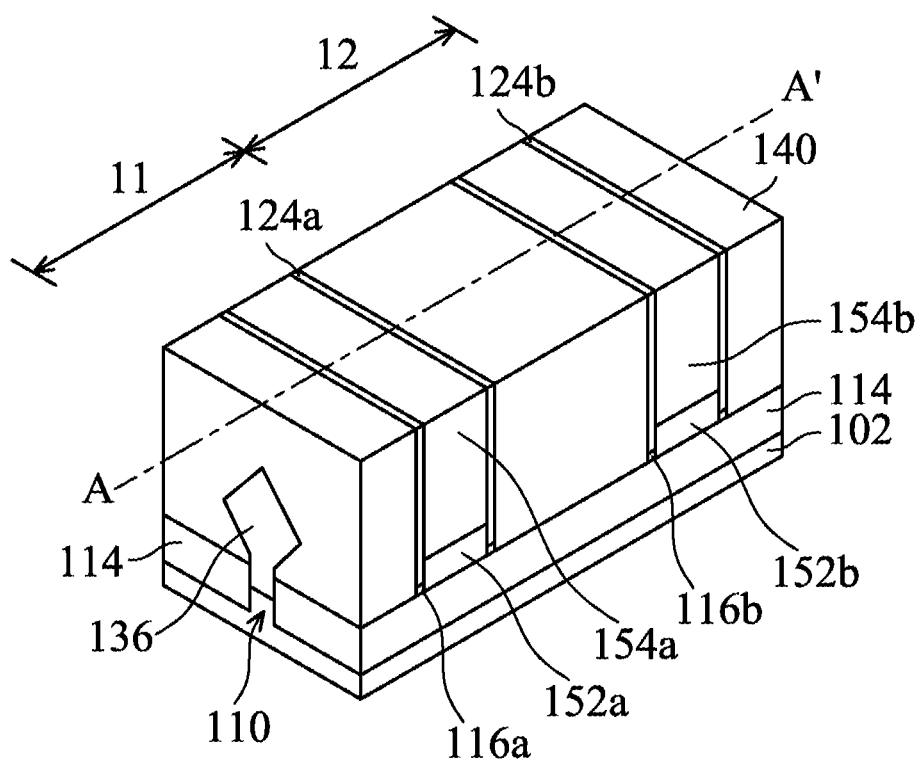
Figure 2J:
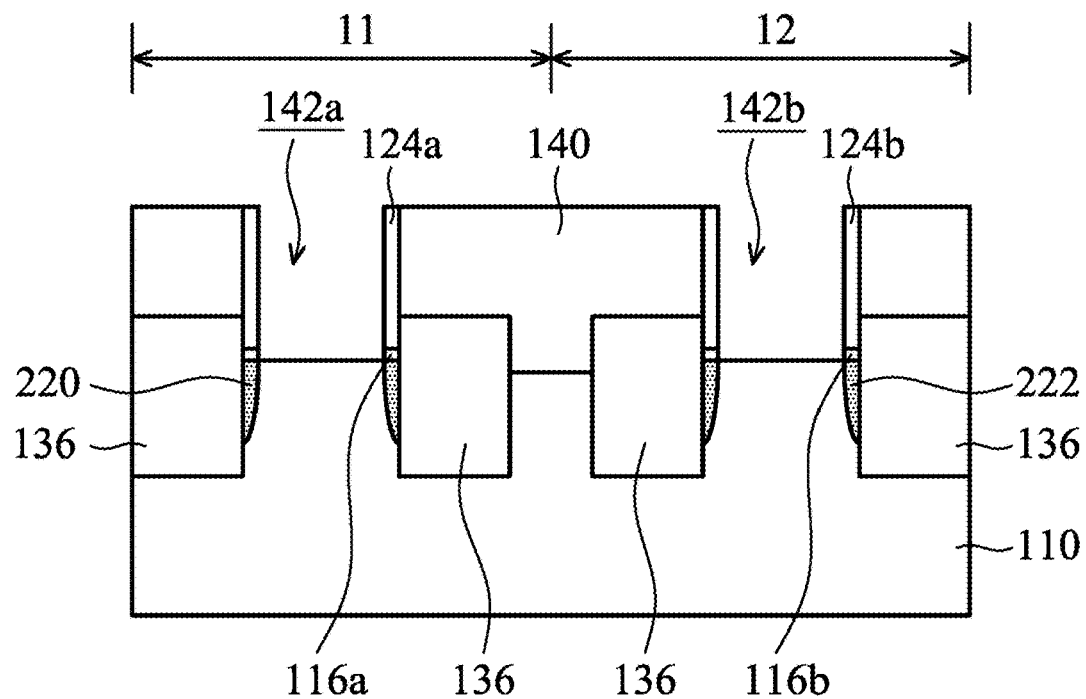

Afterwards, as shown in FIG. 1N and FIG. 2J, the first hard mask layer 120a, the second hard mask layer 120b, the first dummy gate electrode 118a, the second dummy gate electrode 118b, a portion of the first dummy gate dielectric layer 116a, and a portion of the second dummy gate dielectric layer 116b are removed, in accordance with some embodiments. As a result, a first trench 142a in the first region 11 and a second trench 142b in the second region are formed.

It should be noted that a portion of the first dummy gate dielectric layer 116a directly below the first spacer layer 124a is not removed while the first dummy gate electrode 118a is removed. The remaining first dummy gate dielectric layer 116a is between the first spacer layer 124a and the doped region 220 in the first region 11 and is doped with oxygen. Similar to the first dummy gate dielectric layer 116a, the remaining second dummy gate dielectric layer 116b is between the second spacer layer 124a and another doped region 220 and is doped with oxygen.

Figure 2K:
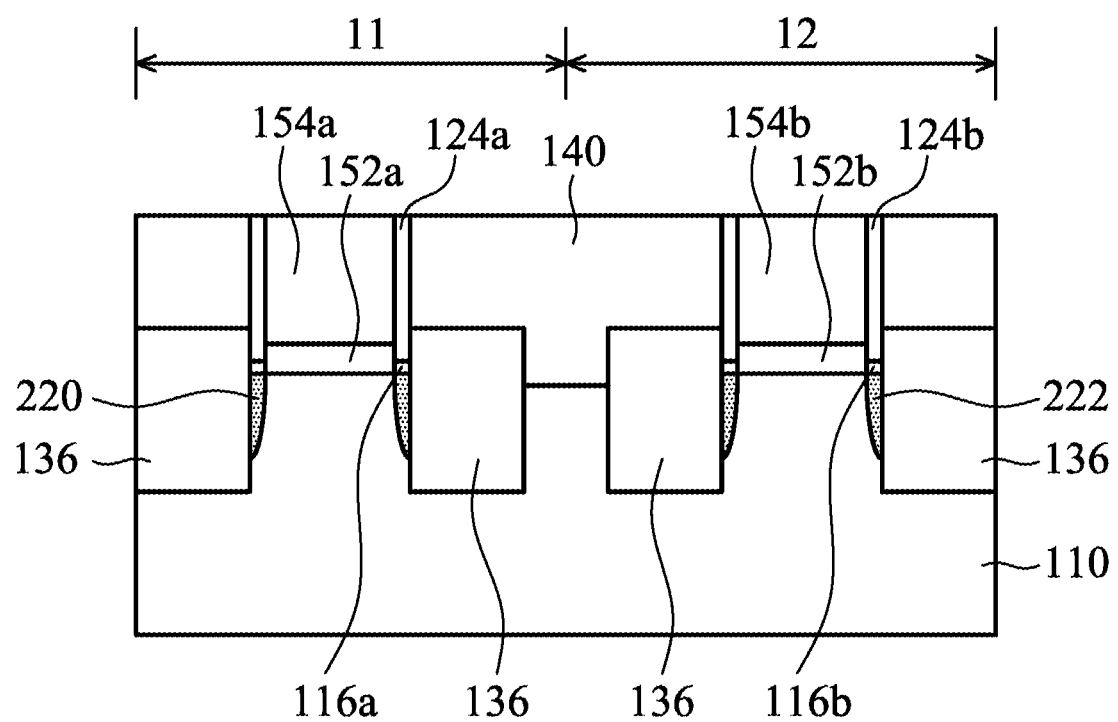

Afterwards, as shown in FIG. 1O and FIG. 2K, a first gate dielectric layer 152a and a first gate electrode 154a are formed in the first trench 142a, and a second gate dielectric layer 152b and a second gate electrode 154b are formed in the second trench 142b, in accordance with some embodiments.

The first gate dielectric layer 152a and the second gate dielectric layer 152b may each be a single layer or multiple layers. The first gate dielectric layer 152a and the second gate dielectric layer 152b are made of silicon oxide (SiOx), silicon nitride (SixNy), silicon oxynitride (SiON), dielectric material(s) with a high dielectric constant (high-k), or a combination thereof. In some embodiments, the first gate dielectric layer 152a and the second gate dielectric layer 152b are deposited by a plasma enhanced chemical vapor deposition (PECVD) process or by a spin coating process.

The first gate electrode layer 154a and the second gate electrode layer 154b are made of conductive material, such as aluminum (Al), copper (Cu), tungsten (W), titanium (Ti), tantalum (Ta), or another applicable material. The first gate electrode layer 154a and the second gate electrode layer 154b are formed by a deposition process, such as chemical vapor deposition (CVD), physical vapor deposition (PVD), atomic layer deposition (ALD), high density plasma CVD (HDPCVD), metal organic CVD (MOCVD), or plasma enhanced CVD (PECVD).

In some embodiments, a work function layer (not shown) may be formed between the first gate dielectric layer 152a and the first gate electrode 154a, and between the second gate dielectric layer 152b and the second gate electrode 154b. The work function layer (not shown) is made of metal material, and the metal material may include N-work-function metal or P-work-function metal. The N-work-function metal includes tungsten (W), copper (Cu), titanium (Ti), silver (Ag), aluminum (Al), titanium aluminum alloy (TiAl), titanium aluminum nitride (TiAlN), tantalum carbide (TaC), tantalum carbon nitride (TaCN), tantalum silicon nitride (TaSiN), manganese (Mn), zirconium (Zr) or a combination thereof. The P-work-function metal includes titanium nitride (TiN), tungsten nitride (WN), tantalum nitride (TaN), ruthenium (Ru) or a combination thereof.

It should be noted that a doped region 220 is formed below the first spacer layer 124a in the first region 11, and the doped region 220 is formed by the plasma doping process 15 (shown in FIG. 1G and FIG. 2C). In some embodiments, the doped region 220 is doped with arsenic (As). Afterwards, the annealing process 17 is performed in the chamber to cause the dopant to diffuse into a portion of the fin structure 110. During the annealing process 17, a gas comprising oxygen is simultaneously provided in the chamber to react with the arsenic (As) to reduce the concentration of the arsenic (As) and the concentration of arsine ($AsH_3$). Therefore, in some embodiments, the concentration of toxic arsine ($AsH_3$) in the chamber is reduced to be lower than 1 ppb, or even lower than 0.5 ppb, to meet safety requirements.

Embodiments for forming a FinFET device structure and method for formation of the same are provided. The FinFET device structure includes a fin structure over a substrate, and a gate electrode formed over a middle portion of the fin structure. A spacer layer is formed on a sidewall of the gate electrode, and a doped region is formed below the spacer layer and in a portion of the fin structure. The doped region is formed by a plasma doping process and an annealing process. In some embodiments, the arsenic (As) generated from a dopant layer reacts with oxygen in the annealing process to reduce the concentration of the arsenic (As) for safety. In addition, the spacer layer and a dummy gate dielectric layer directly below the spacer layer are doped with oxygen. As a result, the performance of the FinFET device structure is improved.

In some embodiments, a method for forming a FinFET device structure is provided. The method includes forming a fin structure over a substrate and forming a dummy gate electrode over a middle portion of the fin structure. The method also includes forming a spacer layer on the dummy gate electrode and on the fin structure and performing a plasma doping process on the dummy gate electrode and on the spacer layer. The method further includes performing an annealing process, wherein the annealing process is performed by using a gas comprising oxygen, such that a doped region is formed in a portion of the fin structure, and the spacer layer is doped with oxygen after the annealing process.

In some embodiments, a method for forming a FinFET device structure is provided. The method includes a forming a fin structure over a substrate and forming a dummy gate electrode over a middle portion of the fin structure. The method includes forming a spacer layer over the dummy gate electrode and the fin structure and forming an arsenic (As) dopant layer over the dummy gate electrode and the fin structure. The method also includes performing a heat treatment process in a chamber on the arsenic (As) dopant layer, wherein arsenic is generated from the arsenic (As) dopant layer during the heat treatment process. The method further includes simultaneously providing a gas comprising oxygen in the chamber, and the arsenic of the arsenic dopant layer reacts with the oxygen to form arsenic oxide ($As_xO_y$).

In some embodiments, a FinFET device structure is provided. The FinFET device structure includes a fin structure formed over a substrate, wherein the fin structure has an edge portion and a middle portion and an isolation structure formed over the substrate. The FinFET device structure also includes a gate electrode formed over the middle portion of the fin structure and a spacer layer formed on a sidewall of the gate electrode, and the spacer layer is made of oxygen-doped nitride. The FinFET device structure further includes a doped region formed below the spacer layer and in a portion of the fin structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a fin field effect transistor (FinFET) device structure, comprising:
    forming a fin structure over a substrate;
    forming a dummy gate dielectric layer over the fin structure;
    forming a dummy gate electrode over a middle portion of the fin structure;
    forming a spacer layer on the dummy gate electrode and on the fin structure and directly above a portion of the dummy gate dielectric layer that is below the dummy gate electrode;
    forming a dopant source layer on the dummy gate electrode and on the spacer layer;
    introducing a gas comprising oxygen on the dopant source layer;
    performing a heating process, wherein performing the heating process and introducing the gas comprising oxygen are simultaneously performed, such that a doped region is formed in a portion of the fin structure and directly below the portion of the dummy gate dielectric layer, and the spacer layer is doped with oxygen after the heating process;
    forming an inter-layer dielectric (ILD) structure next to the spacer layer;
    removing the dummy gate electrode and a rest of the dummy gate dielectric layer to form a trench while keeping the portion of the dummy gate dielectric layer not removed; and
    filling a high-k gate dielectric layer and a metal gate electrode in the trench such that the high-k gate dielectric layer is in contact with the portion of the dummy gate dielectric layer.

2. The method for forming the fin field effect transistor (FinFET) device structure as claimed in claim 1, further comprising:
    performing a knock-on process to drive a dopant of the dopant source layer into the fin structure before the heating process.

3. The method for forming the fin field effect transistor (FinFET) device structure as claimed in claim 2, wherein the dopant source layer comprises an arsenic (As) dopant layer, and arsenic generated from the arsenic (As) dopant layer reacts with oxygen during the heating process.

4. The method for forming the fin field effect transistor (FinFET) device structure as claimed in claim 2, wherein the knock-on process is performed by using a gas comprising hydrogen ($H_2$), nitrogen ($N_2$), helium (He), argon (Ar), krypton (Kr), xenon (Xe), neon (Ne) or a combination thereof.

5. The method for forming the fin field effect transistor (FinFET) device structure as claimed in claim 1,
    wherein the dummy gate dielectric layer is formed between the fin structure and the spacer layer, and the dummy gate dielectric layer is doped with oxygen after the heating process.

6. The method for forming the fin field effect transistor (FinFET) device structure as claimed in claim 1, wherein the spacer layer has an oxygen-gradient concentration, and the oxygen-gradient concentration is gradually decreased from a top surface to a bottom surface of the spacer layer after the heating process.

7. The method for forming the fin field effect transistor (FinFET) device structure as claimed in claim 1, further comprising:
    removing a portion of the fin structure to form a recess; and
    forming a source/drain structure in the recess, wherein the source/drain structure is adjacent to the doped region.

8. The method for forming the fin field effect transistor (FinFET) device structure as claimed in claim 1, wherein the portion of the dummy gate dielectric layer is between the doped region and the spacer layer.

9. A method for forming a fin field effect transistor (FinFET) device structure, comprising:
    forming a fin structure over a substrate;
    forming a dummy gate dielectric layer over the fin structure;
    forming a dummy gate electrode over a middle portion of the fin structure;
    forming a spacer layer over the dummy gate electrode and the fin structure and directly above a portion of the dummy gate dielectric layer that is below the dummy gate electrode;
    forming an arsenic (As) dopant layer over the dummy gate electrode and the fin structure;
    performing a heat treatment process in a chamber on the arsenic (As) dopant layer, wherein a first portion of arsenic of the arsenic dopant layer is diffused into a portion of the fin structure below the spacer layer and directly below the portion of the dummy gate dielectric layer, and a second portion of arsenic is evaporated from the arsenic (As) dopant layer during the heat treatment process; and providing a gas comprising oxygen in the chamber, wherein the second portion of arsenic of the arsenic dopant layer reacts with oxygen in the chamber to form arsenic oxide (AsxOy), wherein the heat treatment process and providing the gas comprising oxygen are simultaneously performed;

wherein the first portion of arsenic of the arsenic dopant layer is diffused into the portion of the fin structure below the spacer layer to form an arsenic doped region after the heat treatment process.

10. The method for forming the fin field effect transistor (FinFET) device structure as claimed in claim 9, further comprising:

performing a knock-on process on the arsenic dopant layer before the heat treatment process, wherein the knock-on process is performed by using a gas comprising hydrogen ($H_2$), nitrogen ($N_2$), helium (He), argon (Ar), krypton (Kr), xenon (Xe), neon (Ne) or a combination thereof.

11. The method for forming the fin field effect transistor (FinFET) device structure as claimed in claim 9, further comprising:

forming a source/drain structure adjacent to the arsenic doped region.

12. The method for forming the fin field effect transistor (FinFET) device structure as claimed in claim 9, wherein the spacer layer is doped with oxygen after the heat treatment process is performed.

13. The method for forming the fin field effect transistor (FinFET) device structure as claimed in claim 9, wherein the dummy gate dielectric layer is formed between the fin structure and the spacer layer, and the dummy gate dielectric layer is doped with oxygen after the heat treatment process.

14. The method for forming the fin field effect transistor (FinFET) device structure as claimed in claim 9, further comprising:

removing the dummy gate electrode and a rest of the dummy gate dielectric layer to form a trench while keeping the portion of the dummy gate dielectric layer not removed; and filling a high-k gate dielectric layer and a metal gate electrode in the trench such that the high-k gate dielectric layer is in contact with the portion of the dummy gate dielectric layer.

15. The method for forming the fin field effect transistor (FinFET) device structure as claimed in claim 9, further comprising:

removing the dummy gate electrode and a rest of the dummy gate dielectric layer to form a trench while keeping the portion of the dummy gate dielectric layer not removed; and filling a high-k gate dielectric layer and a metal gate electrode in the trench such that the high-k gate dielectric layer is in contact with the portion of the dummy gate dielectric layer.

16. A method for forming a fin field effect transistor (FinFET) device structure, comprising:

forming a fin structure over a substrate;

forming a dummy gate dielectric layer over the substrate and the fin structure;

forming a dummy gate electrode over the dummy gate dielectric layer;

depositing a dopant source layer over the dummy gate electrode by using a first gas comprising an arsenic dopant source gas;

performing a knock-on process on the dopant source layer to drive a portion of dopants of the dopant source layer into a portion of the fin structure;

after the knock-on process, heating the dopant source layer in a chamber while introducing a second gas comprising an oxygen gas into the chamber to react with another portion of the dopants of the dopant source layer evaporating in the chamber, wherein the heating the dopant source layer diffuses the portion of dopants of the dopant source layer directly below a portion of the dummy gate dielectric layer that is below the dummy gate electrode;

wherein the dummy gate dielectric layer is doped with oxygen, removing the dummy gate electrode and a rest of the dummy gate dielectric layer to form a trench while keeping the portion of the dummy gate dielectric layer not removed; and filling a high-k gate dielectric layer and a metal gate electrode in the trench such that the high-k gate dielectric layer is in contact with the portion of the dummy gate dielectric layer.

17. The method for forming the fin field effect transistor (FinFET) device structure as claimed in claim 16, wherein the dummy gate dielectric layer is doped with oxygen, and wherein the method further comprises:

removing the dummy gate electrode and a rest of the dummy gate dielectric layer to form a trench while keeping the portion of the dummy gate dielectric layer not removed; and filling a high-k gate dielectric layer and a metal gate electrode in the trench such that the high-k gate dielectric layer is in contact with the portion of the dummy gate dielectric layer.

18. The method for forming the fin field effect transistor (FinFET) device structure as claimed in claim 16, wherein the arsenic dopant source gas is arsine ($AsH_3$).

19. The method for forming the fin field effect transistor (FinFET) device structure as claimed in claim 16, wherein the first gas further comprises argon (Ar), neon (Ne), helium (He), hydrogen (H), Krypton (Kr), Xenon (Xe), or a combination thereof.

20. The method for forming the fin field effect transistor (FinFET) device structure as claimed in claim 16, further comprising:

introducing a third gas comprising hydrogen ($H_2$), nitrogen ($N_2$), helium (He), argon (Ar), krypton (Kr), xenon (Xe), neon (Ne) or a combination thereof on the dopant source layer before heating the dopant source layer in the chamber.

21. The method for forming the fin field effect transistor (FinFET) device structure as claimed in claim 16, further comprising:

forming a spacer layer over the fin structure and directly above a portion of the dummy gate dielectric layer that is below the dummy gate electrode.

* * * * *